United States Patent [19]

Ciszek et al.

[11] 4,299,64

[45] Nov. 10, 198

[54] METHOD AND APPARATUS FOR DRAWING MONOCRYSTALLINE RIBBON FROM A MELT

[75] Inventors: Theodore F. Ciszek, Evergreen, Colo.; Guenter H. Schwuttke, Poughkeepsie, N.Y.

[73] Assignee: The United States of America as represented by the United States Department of Energy, Washington, D.C.

[21] Appl. No.: 179,919

[22] Filed: Aug. 20, 1980

[51] Int. Cl.³ .............................................. C30B 15/34
[52] U.S. Cl. ................................. 156/608; 422/246
[58] Field of Search ....... 156/608, DIG. 88, DIG. 83, 156/617 SP; 422/246, 249, DIG. 64; 148/1.5, 171; 164/60; 264/299, 104; 425/461, 113

[56] References Cited

U.S. PATENT DOCUMENTS

| | | |
|---|---|---|
| 3,015,592 | 1/1962 | Leopold .............................. 156/608 |
| 3,096,158 | 7/1963 | Gavlé et al. ........................ 422/2 |
| 3,129,061 | 2/1964 | Dermatis et al. .................. 428/1 |
| 3,687,633 | 8/1972 | La Belle et al. ................... 422/2 |
| 3,755,011 | 8/1973 | Kleinknecht ....................... 148/1 |
| 4,000,030 | 12/1976 | Ciszek ............................... 156/6 |
| 4,075,055 | 2/1978 | Ciszek et al. ...................... 156/6 |
| 4,121,965 | 10/1978 | Leipold ............................. 156/6 |

FOREIGN PATENT DOCUMENTS 612796 6/1978 U.S.S.R. ............................. 426/4

*Primary Examiner*—Hiram Bernstein
*Attorney, Agent, or Firm*—Michael F. Esposito; Richa; G. Besha; James E. Denny

[57] ABSTRACT

A method and apparatus for drawing a monocrystallir ribbon or web from a melt comprising utilizing a sha ing die including at least two elements spaced one fro the other each having a portion thereof located belo the level of the melt and another portion located abo\ the level of the melt a distance sufficient to form a raise meniscus of melt about the corresponding element.

16 Claims, 3 Drawing Figures

METHOD AND APPARATUS FOR DRAWING MONOCRYSTALLINE RIBBON FROM A MELT

BACKGROUND OF THE INVENTION

The present invention is related to a process and apparatus for producing monocrystalline ribbons or webs of suitable material. In particular, the present invention relates to a process and apparatus for drawing monocrystalline ribbons or webs from a melt comprising materials such as silicon, germanium, intermetallic compounds, sapphire, garnet, and the like.

The growth of monocrystalline ribbons of suitable materials such as silicon has been accomplished by several processes such as Dendritic Web, Stepanov, and Edge Defined Film Fed Growth (EFG). The Dendritic Web procedure entails a solidification of the silicon sheet from a melt meniscus which is bounded at the ends by thin dendrites growing downward into a supercooled melt region and bounded at the top by a ribbon-melt interface. The Stepanov method utilizes a non-wetting die in contact with the melt. The die shapes the meniscus for ribbon growth. In the EFG technique, the crystal is grown from a thin molten zone of liquid at the top surface of a capillary die. As the crystal grows, fresh liquid is supplied from a melt reservoir in a crucible via capillary rise through channels in the die. For a more detailed discussion of these methods reference is made to U.S. Pat. No. 4,075,005 to Ciszek, et al.

U.S. Pat. No. 4,000,030 to Ciszek discloses an alternative to the EFG process for growing monocrystalline materials. This process utilizes the surface tension of the melt to form a raised meniscus of the melt about a projection extending above the melt surface. The meniscus, of the melt, conforms to the cross-section of the projection to enable control of the configuration of the drawn crystal.

While the above-described techniques have been used to grow ribbons possessing adequate crystallographic structure they do suffer from numerous disadvantages. The Dendritic Web process is limited to a fixed (111) crystal orientation, and width control is difficult due to dendrite spreading. In addition, that procedure requires exacting temperature control. The other methods, described above, while in principle allowing for any crystal surface orientation, produce crystal structures which are severely impaired due to contamination of the melt by the die, and the short distance or meniscus height between the die-top and the solidification front.

SUMMARY OF THE INVENTION

It is the primary object of the present invention to provide a new and improved apparatus and method for growing at least one ribbon or web of monocrystalline material from a melt.

It is another object of the present invention to provide a new and improved apparatus and method for growing at least one ribbon or web of monocrystalline semiconductor material from a melt.

It is a further object of the present invention to provide a new and improved apparatus and method for growing at least one ribbon or web of monocrystalline semiconductor material from a melt wherein the resulting semiconductor ribbon is substantially uncontaminated.

It is a still further object of the present invention to provide a new and improved apparatus and method for growing at least one ribbon or web of monocrystalline material from a melt wherein the width of the ribbon or web is between about 1 to 5 cm.

It is another object of the present invention to provide a new and improved apparatus and method for simultaneously growing at least two ribbons or webs of monocrystalline material from the same melt.

It is still another object of the present invention to provide a new and improved apparatus and method for growing a ribbon or web of monocrystalline material from a melt wherein the monocrystalline material includes silicon, germanium, intermetallic compounds, sapphire, garnet and the like.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects of the present invention as embodied and broadly described herein, the apparatus of this invention comprises a container for the melt material, and a shaping die comprising at least two elements spaced one from the other and capable of being wetted by the melt material. The elements are placed in the container in such a manner that one portion of each element is located below the level of the melt, and a second portion is located above the level of the melt. Each portion located above the level of the melt is at a height at least sufficient to form a raised meniscus of melt about the corresponding element. The distance between the elements is sufficient to provide an area into which a seed ribbon(s) can be placed. Since the elements provide the edge boundaries for the meniscus from which the ribbon(s) grows, the distance between the elements establishes the width of the grown ribbon(s). As shown in FIGS. 1 and 2 the seed ribbon contacts the menisci prior to contact with the melt level and has a width greater than its thickness.

In a preferred embodiment the elements are cone shaped, and the tip of each cone-shaped element is located above the level of the melt.

In a further preferred embodiment the spaced elements are movably mounted in the container permitting variations in the width of the ribbon grown and optimization of the height of the elements in the melt.

In another aspect of the present invention as embodied and broadly described herein, the method of this invention comprises forming a melt of material in a container about the entire surface of a wettable shaping die. The shaping die includes at least two elements spaced one from the other each having a portion thereof below the level of the melt material in the container and another portion located above the level of the melt a height at least sufficient to form a raised meniscus of melt about the corresponding element. The space between the elements is sufficient to provide an area into which at least one seed ribbon can be placed. Preferably, the distance between the elements is about 1 to 5 cm. The seed ribbon(s) is placed between the spaced elements, and lowered until one end contacts the melt surface. The seed ribbon(s) is slowly withdrawn in a direction substantially perpendicular to the melt producing a monocrystalline ribbon(s) of melt material. The grown ribbon(s) possesses a width determined by the distance between the spaced elements of the shaping die. The level of the liquid in the container is maintained constant by replenishing the melt in any conventional manner, so that the height of the portion of the elements located above the level of the melt does not change.

In a preferred embodiment of the present invention the process includes forming the melt from a semiconductor material.

In a further preferred embodiment of the present invention the process includes forming a melt comprising a material such as silicon, garnet, intermetallic compounds, sapphire, germanium or the like. Most preferably, the melt includes silicon.

In another preferred embodiment of the present invention the elements are placed apart one from the other in the melt at a distance of about 1 to 5 cm.

The apparatus and method of the present invention provide several distinct advantages in comparison with the previously described crystal growing techniques and apparatus. For example, unlike the dendritic web procedure, the apparatus and process of the present invention enable (1) any crystal orientation of ribbon to be grown; (2) no critical thermal control of the supercooled melt; (3) no twin plans requirement in the ribbon, and (4) improved width control and stabilization for the ribbon being grown.

The advantages of the apparatus and method of the present invention compared with the Stepanov, EFG, and U.S. Pat. No. 4,000,030 techniques can be summarized as follows: (1) there is no requirement for a narrow meniscus between the solid/liquid interface and die top substantially reducing susceptibility to thermal perturbations; (2) only a small volume wettable spaced elements are required greatly reducing melt contamination problems, particularly under the entire central area of the ribbon or web; (3) wettable spaced elements made from diamonds are economically feasible, further reducing contamination problems; and (4) purification by normal freezing segregation can occur, which is not possible using narrow capillary channels.

BRIEF DESCRIPTION OF THE DRAWINGS

The accompanying drawings, which are incorporated in and form a part of the specification, illustrate various preferred embodiments of the present invention, and, together with the description, serve to explain the principles of the invention. In the drawings.

DETAILED DESCRIPTION OF THE INVENTION

Figure 1:
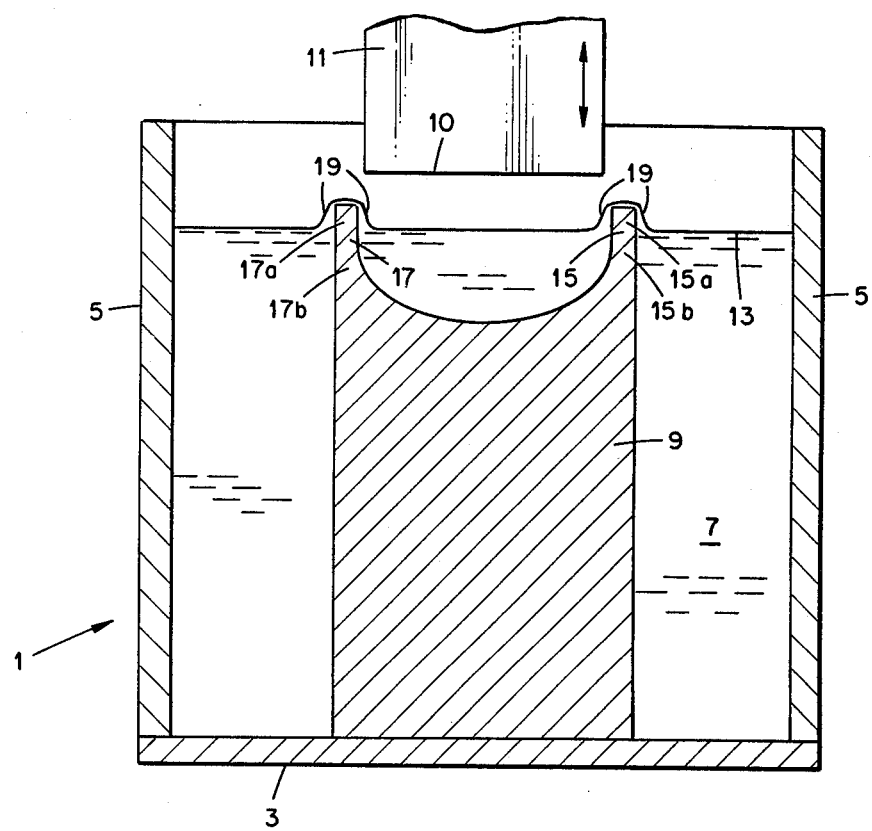
FIG. 1 is a schematic view in cross-section of an apparatus for a drawing monocrystalline ribbon from a melt in accordance with a preferred embodiment of the present invention and specifically illustrating a preferred shaping die.

With reference to the drawings, FIG. 1 illustrates a container 1 having a bottom wall 3 and upstanding side walls 5 for holding a melt 7. Extending upwardly from the bottom wall 3 is a shaping die 9 including a pair of elements 15 and 17 spaced one from the other and from side walls 5. Element 15 has portions 15a and 15b located, respectively, above and below the melt level 13 of melt 7 in container 1. Likewise, element 17 has portions 17a and 17b located, respectively, above and below the melt level 13 of melt 7 in container 1. Portions 15a and 17a located above melt level 13 extend a height above melt level 13 at least sufficient to form a pair of raised minisci 19 of melt 7 about elements 15 and 17. Elements 15 and 17 are spaced one from the other a distance at least sufficient to provide an area into which a seed ribbon 11 can be disposed for contact with melt 7. It is, of course, understood that although shaping die 9 is shown as an integral extension of bottom wall 3 it may also constitute a discrete member suitably secured in extension to container 1. Additionally, it should be understood that shaping die 9 may include one or more additional spaced elements, similar to elements 15 and 17, which will permit simultaneous drawing of a plurality of monocrystalline webs or ribbons by the use of multiple seed ribbons 11. For example, the use of three elements spaced one from the other will enable simultaneous withdrawal of two webs by using two seed ribbons or, if arranged as the apices of a triangle simultaneous withdrawal of three webs by using three seed ribbons.

Shaping die 9 can be formed of any suitable material wettable by melt 7. The melt will wet up the sides of the spaced elements 15 and 17 because of surface tension forming a convex or raised meniscus about the spaced elements 15 and 17. The shaping die 9 can be formed of high density graphite, silicon carbide, diamond, iridium, or molybdenum depending upon the monocrystalline ribbon or web material grown.

In accordance with the process of the present invention, container 1 is charged with a material capable of being withdrawn in the form of a monocrystalline ribbon or web. Materials such as silicon, germanium, garnet, sapphire, or the like are suitable. The melt is formed in a conventional manner such as that described in U.S. Pat. No. 4,000,030. The melt is maintained at a level such that melt level 13 is below portion 15a and 17a of spaced elements 15 and 17, respectively, of shaping die 9. Melt 7 is maintained at a controlled height so that the surface tension between melt 7 and shaping die 9 at melt level 13 causes melt 7 to rise and wet the sides of portions 15a and 17a of spaced elements 15 and 17, respectively, forming a pair of raised minisci 19 about the elements.

The procedure of the present invention includes lowering seed ribbon 11 to contact seed ribbon end 10 with melt 7 at melt level 13 in the area provided between spaced elements 15 and 17. Seed ribbon 11 is slowly withdrawn from contact with melt level 13 by pulling ribbon 11 in a direction substantially perpendicular to melt 7. The pulling operation can be performed by any conventional mechanism. For details regarding a pulling mechanism see U.S. Pat. No. 4,075,055. The width of the monocrystalline ribbon or web withdrawn from melt 7 is determined by the distance between elements 17 and 15. Usually, the elements are spaced apart one from the other a distance of about 1 to 5 cm.

Figure 2:
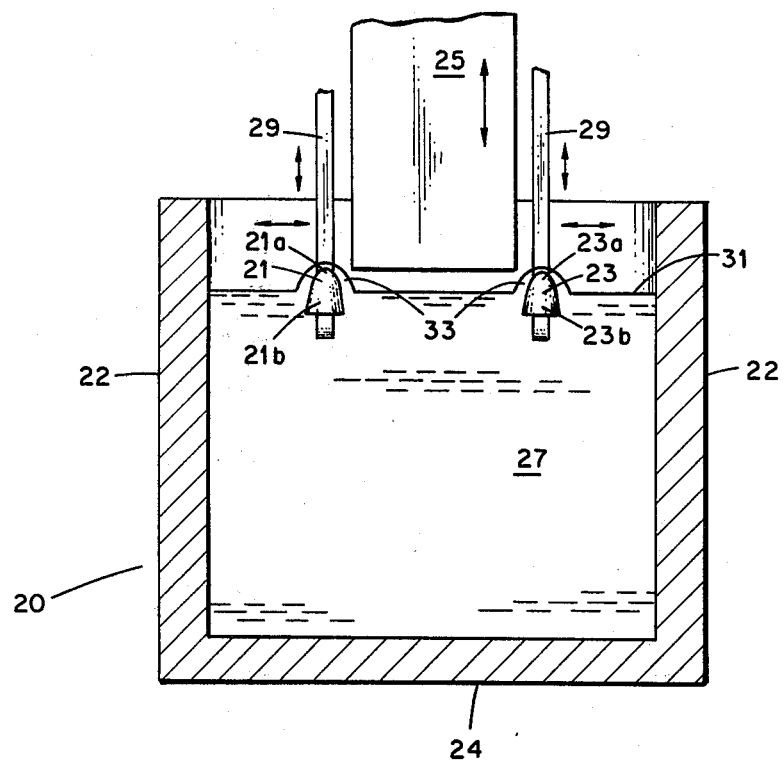
FIG. 2 is a schematic view in cross-section similar to FIG. 1 illustrating a second preferred shaping die.

FIG. 2 illustrates a view similar to that of FIG. 1 utilizing a second preferred configuration for the shaping die. With reference to FIG. 2, container 20 has bottom wall 24 and side walls 22 for containment of a melt 27. Extending into melt 27 are a pair of shaping die elements 29 having cone-shaped configurations 21 and 23. Shaping die elements 29 are spaced one from the other a distance sufficient to provide an area into which a seed ribbon 25 can be disposed. The cone-shaped configuration 21 of shaping die 29 has portions 21a and 21b located respectively above and below the melt level 31 of melt 27. Likewise, cone-shaped configuration 23 of shaping die 29 has portions 23a and 23b located, respectively, above and below the melt level 31 of melt 27.

Portions 21a and 23a of cone-shaped configurations 21 and 23, respectively, are maintained at a height above melt level 31 such that the surface tension between melt 27 and shaping die 29 at melt level 31 causes melt 27 to rise and wet the portions 21a and 23a of cone-shaped configurations 21 and 23, respectively, forming a pair of raised minisci 33 about elements 21 and 23. Shaping die 29 is depicted in FIG. 2 as being movably mounted permitting both vertical and horizontal movement of spaced elements 21 and 23. This movable mounting permits adjustments to be made in the width of the ribbon grown as well as optimization of the height of elements 21 and 23 in melt 27. It is, of course, understood that additional shaping die elements 29 may be utilized enabling simultaneous drawing of a plurality of monocrystalline webs or ribbon with the use of multiple seed ribbons 25.

Figure 3:
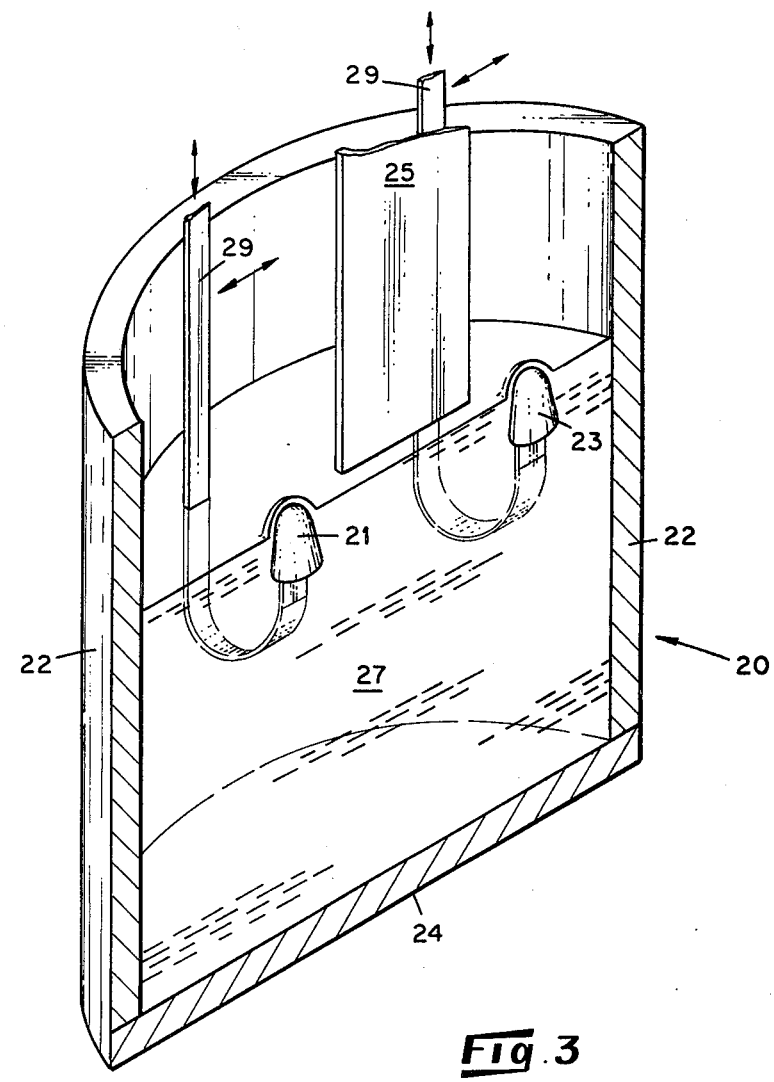
FIG. 3 is a perspective view illustrating the embodiment shown in FIG. 2.

FIG. 3 is a perspective view of the same embodiment described in detail by reference to FIG. 2. The reference numerals of FIG. 3 correspond to the same elements set forth in FIG. 2. Accordingly, no detailed description of FIG. 3 is necessary.

While not being limited to a particular theory, it is postulated that the apparatus and process of the present invention substantially overcome the contamination and orientation problem of the previously discussed techniques by (1) reducing the volume of the shaping die required in the melt and (2) minimizing the contact area between the shaping die and melt beneath the central area of the seed ribbon or web.

The foregoing description of the preferred embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What we claim as our invention as:

1. Apparatus for growing at least one ribbon of monocrystalline material from a melt by use of at least one seed ribbon comprising:
   a. a container for the melt material,
   b. a shaping die including at least two elements spaced one from the other with each element having one portion thereof located below the level of the melt in the container and a second portion located above the level of the melt a height at least sufficient to form a raised meniscus of melt about the corresponding element, said elements being spaced one from the other a distance sufficient to provide an area between said elements into which said seed ribbon can be placed to contact said melt and which distance determines the width of the grown ribbon.

2. The apparatus of claim 1 wherein said elements are cone-shaped.

3. The apparatus of claim 1 or 2 wherein the tip said cone-shaped elements is located above the level the melt.

4. The apparatus of claim 1 wherein the elements the shaping die are movably mounted enabling horizc tal positioning of said spaced elements.

5. The apparatus of claim 1 wherein the elements the shaping die are movably mounted enabling vertic positioning of said spaced elements.

6. The apparatus of claim 1 wherein the elements the shaping die are movably mounted enabling bc vertical and horizontal positioning of said spaced e ments.

7. The apparatus of claim 1 wherein said elements a spaced apart one from the other a distance about 1 tc cm.

8. A method for growing at least one ribbon of mon crystalline material from a melt by the use of at least o seed ribbon comprising:
   a. forming a melt of said material in a container abc the surface of a wettable shaping die including least two elements spaced one from the other,
   b. locating each element relative to the surface of t melt material so that each element has one porti thereof located below the level of the melt mater in the container and a second portion located abo the level of the melt a height at least sufficient form at least a pair of raised meniscus of melt abc the corresponding element, said elements bei spaced one from the other a distance sufficient provide an area therebetween for receiving sa seed ribbon,
   c. placing at least one seed ribbon between said e ments of said shaping die,
   d. contacting at least one seed ribbon along one e with the melt surface, and
   e. withdrawing at least one seed ribbon in a directi substantially perpendicular to said melt mater thereby producing at least one monocrystalli ribbon of melt material.

9. The method of claim 8 or 1 including forming melt of semiconductor material.

10. The method of claim 8 or 1 including forming melt comprised of a material selected from the gro consisting of silicon, germanium, sapphire intermetal compounds, and garnet.

11. The method of claim 8 or 1 including forming melt material comprising silicon.

12. The method of claim 8 or 1 including positioni the elements apart from one another at a distance about 1 to 5 cm.

13. An apparatus for growing at least one ribbon monocrystalline material from a melt by use of at le one seed ribbon having a width greater than its thic ness comprising:
   a. a container for the melt material;
   b. a shaping die including at least two eleme spaced one from the other with each element ha ing a first portion located below the level of t melt in the container and a second portion locat above the level of the melt in the container a height sufficient to form at least a pair of rais menisci of melt about the second portion, said e ments being spaced one from the other a distan greater than the width of the seed ribbon sufficie to provide an area between said elements ir which said seed ribbon can be placed to conta said melt and which distance determines the width of the grown ribbon.

14. A method for growing at least one ribbon of monocrystalline material from a melt by the use of at least one seed ribbon having a width greater than its thickness comprising:
a. providing a melt of said material in a container about the surface of a wettable shaping die including at least two elements spaced one from the other,
b. locating each element relative to the portion of the melt material so that each element has a first portion located below the level of the melt material in the container and a second portion located above the level of the melt in the container a height sufficient to form at least a pair of raised menisci of melt about the second portion,
c. locating said elements one from the other a distance greater than the width of the seed ribbon sufficient to provide an area between the elements into which said seed ribbon can be located to contact said melt,
d. placing at least one seed ribbon between said elements of said shaping die,
e. contacting said one seed ribbon along one end with the melt surface, and
f. withdrawing said one seed ribbon in a direction substantially perpendicular to the surface of said melt material thereby producing at least one monocrystalline ribbon of melt material.

15. An apparatus for growing at least one ribbon of monocrystalline material from a melt by use of at least one seed ribbon having a width greater than its thickness comprising:
a. a container for the melt material,
b. a shaping die including at least two elements spaced one from the other with each element having a first portion located below the level of the melt in the container and a second portion located above the level of the melt a height at least sufficient to form at least a pair of raised menisci of melt about the second portion, said elements being spaced one from the other a distance greater than the width of the seed ribbon sufficient to provide an area between said elements into which said seed ribbon can be placed to contact said menisci prior to contact with said melt level, and which distance determines the width of the grown ribbon.

16. A method for growing at least one ribbon of monocrystalline material from a melt using at least one seed ribbon having a width greater than its thickness comprising:
a. providing a melt of said material in a container about the surface of a wettable shaping die including at least two elements spaced one from the other,
b. locating each element relative to the surface of the melt material so that each element has a first portion located below the level of the melt material in the container and a second portion located above the level of a melt a height sufficient to form at least a pair of raised menisci of melt about the second portion, said elements being spaced one from the other a distance greater than the width of the seed ribbon to provide an area between the elements into which said seed ribbon can be located to contact said melt,
c. placing at least one seed ribbon between said elements of said shaping die,
d. contacting said seed ribbon along one end with said menisci and subsequently with the melt level, and
e. withdrawing said seed ribbon in a direction substantially perpendicular to said melt material thereby producing a least one monocrystalline ribbon of melt material.

* * * * *

UNITED STATES PATENT OFFICE
CERTIFICATE OF CORRECTION

Patent No. 4,299,648　　　　　　　　　Dated November 10, 1981

Inventor(s) Theodore F. Ciszek and Guenter H. Schwuttke

It is certified that error appears in the above-identified patent and that said Letters Patent are hereby corrected as shown below:

Claims 2, 4, 5, 6 and 7, line 1, after "1" insert -- , 13 or 15 --.

Claim 3, line 1, after "2" insert -- , 13 or 15 --.

Claims 9, 10, 11 and 12, line 1, after "8" insert -- , 14 or 16 --.
Claims 9, 10, 11 and 12, line 1, after "8" delete "or 1".

Signed and Sealed this

Twenty-eighth Day of December 1982

[SEAL]

Attest:

Attesting Officer

GERALD J. MOSSINGHOFF

Commissioner of Patents and Trademarks